US007108579B2

United States Patent
Wada et al.

(10) Patent No.: US 7,108,579 B2
(45) Date of Patent: Sep. 19, 2006

(54) METHOD AND DEVICE FOR POLISHING

(75) Inventors: Yutaka Wada, Tokyo (JP); Tomohiko Akatsuka, Tokyo (JP); Tatsuya Sasaki, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/485,273

(22) PCT Filed: Feb. 20, 2003

(86) PCT No.: PCT/JP03/01869

§ 371 (c)(1),
(2), (4) Date: Jan. 30, 2004

(87) PCT Pub. No.: WO03/071592

PCT Pub. Date: Aug. 28, 2003

(65) Prior Publication Data

US 2004/0235301 A1 Nov. 25, 2004

(30) Foreign Application Priority Data

Feb. 20, 2002 (JP) .............................. 2002-043471

(51) Int. Cl.
*B24B 49/00* (2006.01)
*B24B 1/00* (2006.01)
(52) U.S. Cl. .................. 451/8; 451/9; 451/36; 451/41; 451/56; 451/60; 451/287; 451/288; 451/443; 451/444; 451/446
(58) Field of Classification Search .................. 451/8, 451/9, 36, 41, 56, 60, 287, 288, 443, 444, 451/446
See application file for complete search history.

(56) References Cited

U.S. PATENT DOCUMENTS

| 5,948,205 | A | * | 9/1999 | Kodera et al. .......... 156/345.13 |
| 6,200,201 | B1 | * | 3/2001 | Ravkin et al. ................ 451/65 |
| 6,343,978 | B1 | | 2/2002 | Shimizu et al. |
| 6,565,422 | B1 | * | 5/2003 | Homma et al. ............... 451/67 |
| 6,653,242 | B1 | * | 11/2003 | Sun et al. .................... 438/738 |
| 2002/0028581 | A1 | * | 3/2002 | Yasui et al. ................. 438/689 |

FOREIGN PATENT DOCUMENTS

| EP | 1 050 369 | 11/2000 |
| EP | 1 077 108 | 2/2001 |
| JP | 2000-160136 | 6/2000 |
| JP | 2000-315665 | 11/2000 |
| JP | 2001-57352 | 2/2001 |
| JP | 2001-127022 | 5/2001 |
| JP | 2001-351888 | 12/2001 |
| JP | 2002-16025 | 1/2002 |
| JP | 2002-43256 | 2/2002 |
| JP | 2002-324771 | 11/2002 |
| JP | 2003-17447 | 1/2003 |
| WO | 02/066207 | 8/2002 |

* cited by examiner

*Primary Examiner*—Joseph J. Hail, III
*Assistant Examiner*—Shantese L. McDonald
(74) *Attorney, Agent, or Firm*—Wenderoth, Lind & Ponack, L.L.P.

(57) ABSTRACT

The present invention relates to a polishing method for polishing a workpiece by pressing the workpiece, to be polished, against a fixed abrasive and bringing the workpiece into sliding contact with the fixed abrasive. The polishing method includes a first step of polishing the workpiece while supplying a polishing liquid which contains an anionic surface-active agent and does not contain abrasive particles, and a second step of polishing the workpiece while supplying a polishing liquid which contains a cationic surface-active agent and does not contain abrasive particles.

18 Claims, 12 Drawing Sheets

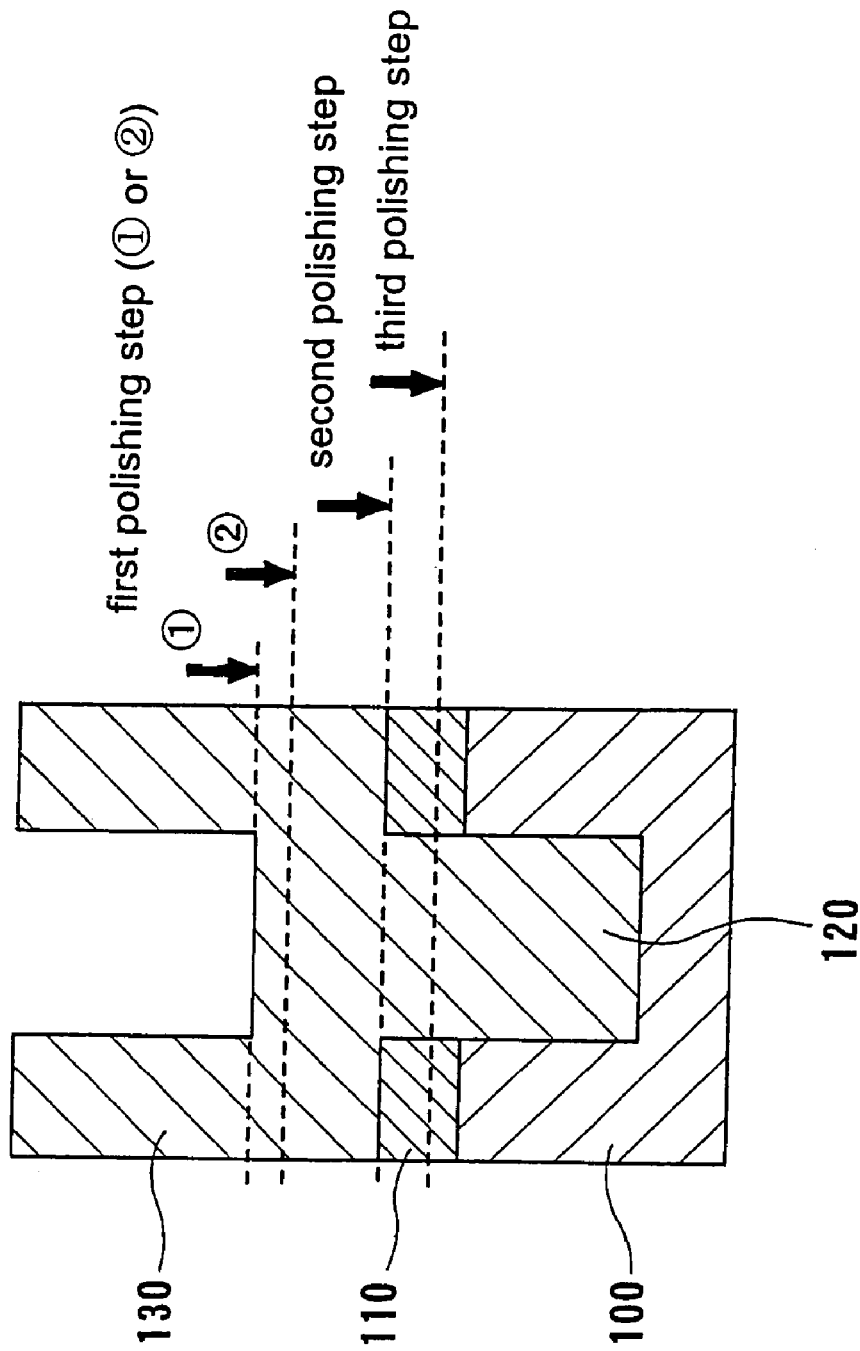

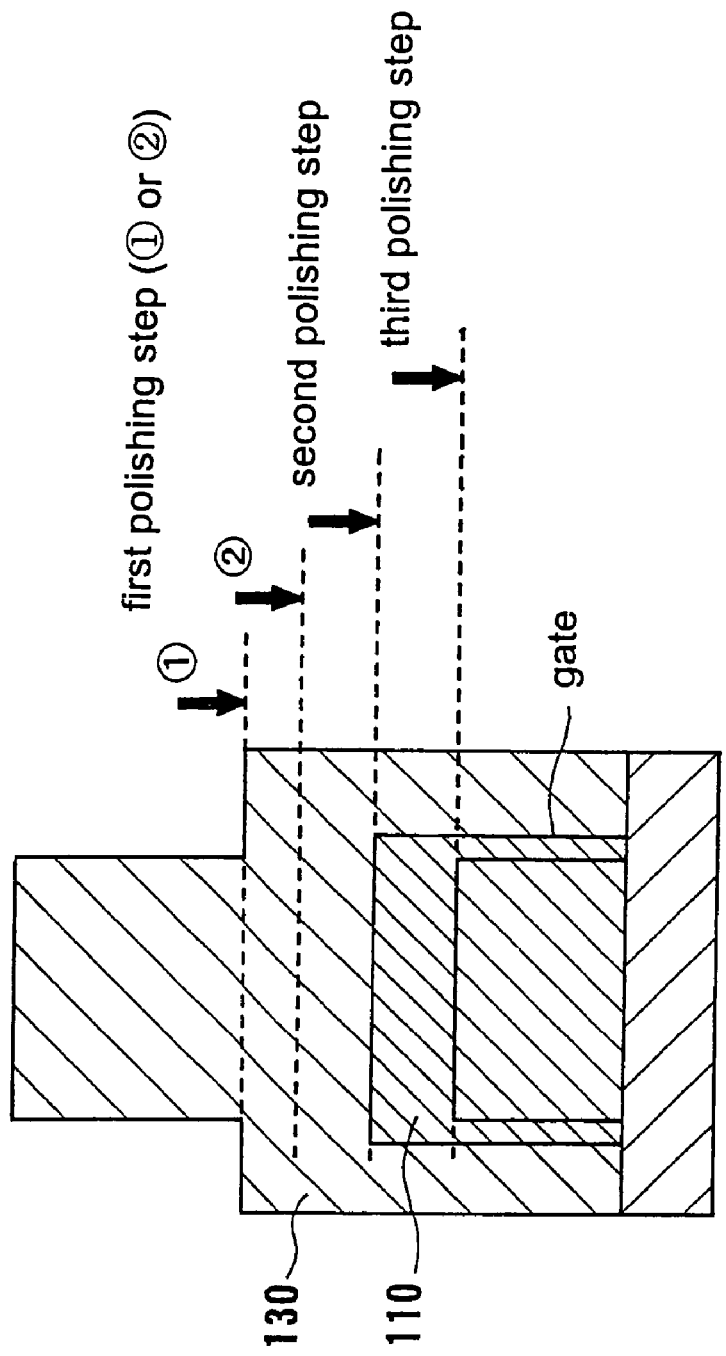

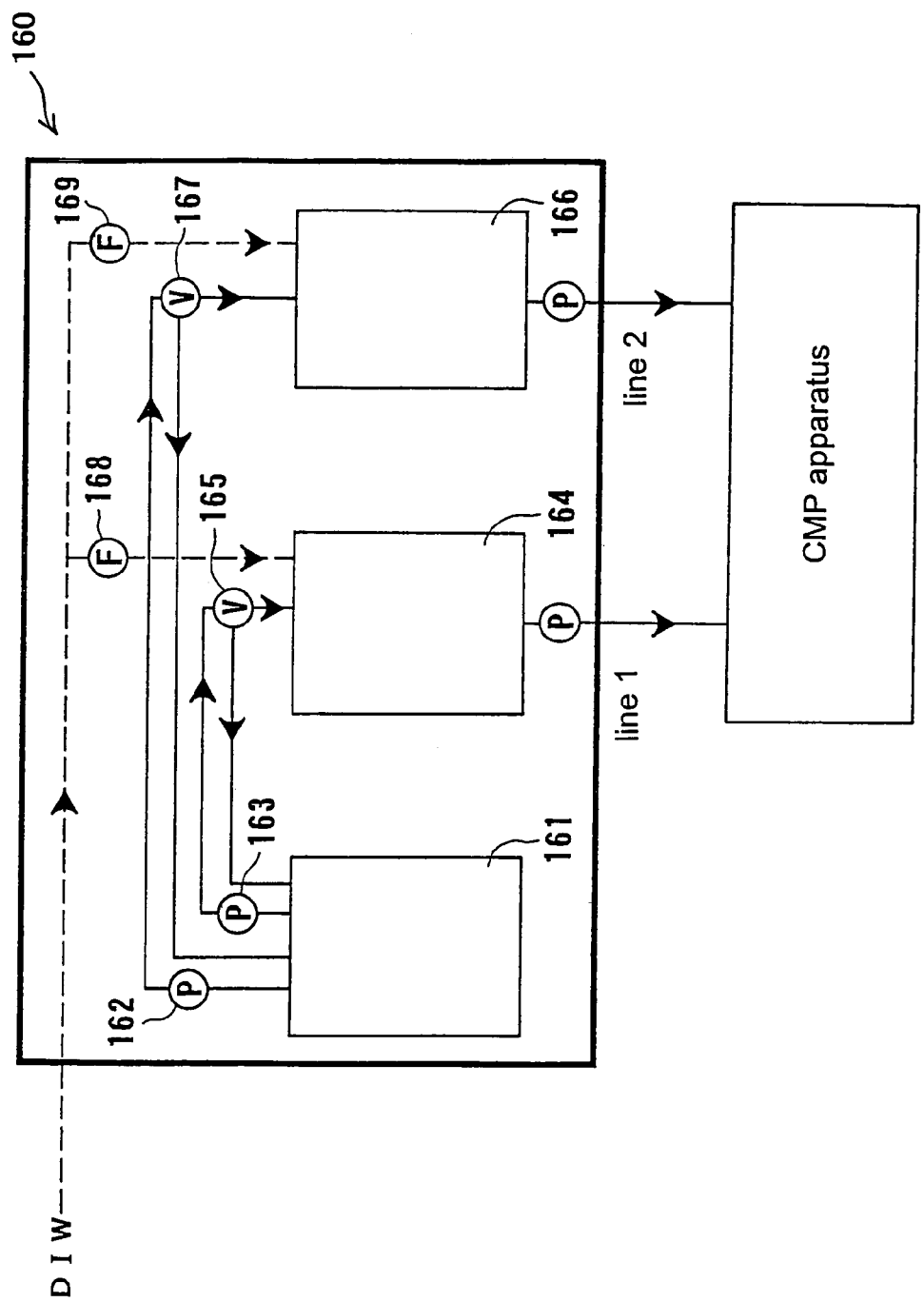

METHOD AND DEVICE FOR POLISHING

This application is a National Stage application of PCT/JP03/01869, filed Feb. 20, 2003.

1. Technical Field

The present invention relates to a polishing method and apparatus, and more particularly to a polishing method and apparatus for polishing a workpiece such as a semiconductor wafer with a fixed abrasive.

2. Background Art

As semiconductor devices have become more highly integrated in recent years, circuit interconnections have become finer and distance between those circuit interconnections becomes smaller. In case of photolithography which can form interconnections that are at most 0.5 μm wide, it is required that surfaces on which pattern images are to be focused by a stepper should be as flat as possible because a depth of focus of an optical system is relatively small. A polishing apparatus for performing chemical mechanical polishing (CMP) has been used for planarizing a semiconductor wafer.

This type of chemical mechanical polishing (CMP) apparatus comprises a polishing table having a polishing pad attached thereon, and a top ring. A workpiece to be polished is disposed between the polishing pad and the top ring and pressed against the polishing pad by the top ring, while a polishing liquid (slurry) is being supplied onto the polishing pad, and hence the workpiece is polished to a flat mirror finish.

The CMP apparatus is used in an STI (Shallow Trench Isolation) forming process for forming a transistor circuit on a lowermost layer of a semiconductor device, for example. FIGS. 3A through 3F are schematic cross-sectional views showing an example of the STI forming process. A nitride film 110 (generally, a film of silicon nitride $Si_3N_4$) is formed on a silicon substrate 100 (see FIG. 3A), and the silicon substrate 100 is etched using the nitride film 110 as a mask, thus forming a trench (groove) 120 (see FIG. 3B). Then, a silicon oxide film 130 made of an insulating material is embedded in the trench 120 (see FIG. 3C).

When the silicon oxide film 130 is embedded in the trench 120, since an excessive layer of the silicon oxide film 130 is left on a surface as shown in FIG. 3C, the excessive layer of the silicon oxide film 130 is removed by CMP, thereby exposing a surface of the nitride film 110 (see FIG. 3D). Then, the nitride film 110 is etched away, thus forming a groove 130a of the silicon oxide film (see FIG. 3E). A transistor 140 is then formed using such groove 130a of the silicon oxide film (see FIG. 3F).

In the STI forming process described above, a purpose of a polishing step using CMP is to completely remove the excessive silicon oxide film formed on the nitride film. If the excessive silicon oxide film is not removed completely, then subsequent etching of the nitride film will be impaired.

However, the polishing step in the above-mentioned conventional STI forming process employs a polyurethane-based polishing pad and a slurry with silica abrasive particles dispersed therein. Since the nitride film 110 is less liable to be polished than the silicon oxide film 130, the silicon oxide film 130 is excessively polished, thus developing dishing as shown in FIG. 4. Furthermore, the nitride film tends to be polished unevenly, resulting in insufficient within-wafer uniformity. In the STI forming process, it is necessary to strictly control thicknesses of the nitride film and the silicon oxide film in a trench, i.e., to uniformize film thickness within a surface of the wafer, and it is important to suppress dishing for within-wafer uniformity.

Recently, it has been attempted to solve the above problems by polishing wafers using a polyurethane-based polishing pad and a slurry with ceria abrasive particles dispersed therein, while adding a high concentration surface-active agent. If a dishing amount developed using a silica slurry is 500 Å, for example, then the dishing amount can be reduced to a range from 200 to 300 Å by this process. However, this process cannot eliminate dishing completely because it also uses a soft polishing pad. Another problem of this process is that the high concentration surface-active agent causes ceria to agglomerate, and this agglomerated ceria scratches the wafer.

In an effort to solve the problems of the polishing processes using an abrasive liquid (slurry) containing abrasive particles and a soft polishing pad, there has been proposed a polishing process using a fixed abrasive as disclosed in Japanese laid-open patent publication No. 2000-173955. Specifically, in Japanese laid-open patent publication No. 2000-173955, there has been proposed a process for polishing a wafer with a fixed abrasive containing ceria and a polishing liquid which contains 1% by weight of ammonium polyacrylate having a molecular weight of 10,000, and has an alkaline pH value. A purpose of this process is to increase a polishing rate by causing the pH alkaline to sufficiently increase dispersion of dropped abrasive particles. However, the publication refers to nothing about optimization of the polishing process which includes multi-stage polishing, dressing, and post-processing.

SUMMARY OF THE INVENTION

The present invention has been made in view of the above problems in the prior art. It is therefore an object of the present invention to provide a polishing method and a polishing apparatus which can suppress dishing in a workpiece having a nitride film and an oxide film formed on the nitride film, and obtain within-wafer uniformity.

In order to solve the problems in the prior art, according to the present invention, there is provided a polishing method for polishing a workpiece by pressing the workpiece to be polished against a fixed abrasive and bringing the workpiece into sliding contact with the fixed abrasive, characterized in that while supplying a polishing liquid which contains an anionic or cationic surface-active agent and does not contain abrasive particles, the workpiece is polished.

According to the present invention, there is also provided a polishing method for polishing a workpiece by pressing the workpiece to be polished against a polishing surface and bringing the workpiece into sliding contact with the polishing surface, the polishing method comprising: a first step of polishing the workpiece while supplying a polishing liquid which contains an anionic surface-active agent; and a second step of polishing the workpiece while supplying a polishing liquid which contains a cationic surface-active agent. The cationic surface-active agent should preferably contain at least one organic compound having any one structure of aliphatic amine salt, aliphatic quaternary ammonium salt, benzalkonium salt, benzethonium chloride, pyridinium salt, or imidazolium salt.

A concentration of the anionic surface-active agent in the polishing liquid is preferably 0.001% by weight to 5% by weight, and a pH of the polishing liquid is preferably 5 to 10. Further, the anionic surface-active agent preferably contains an organic compound having a hydrophilic group selected from COO⁻ group and $SO_3^-$ group. Further, the workpiece preferably has a nitride film and a silicon oxide film deposited on the nitride film.

In a neutral to acidic pH region of the polishing liquid, surfaces of abrasive particles of the fixed abrasive and the surface of the nitride film are principally charged positively (though part of the surfaces possess a negative charge, a positive charge is predominant). Accordingly, the anionic surface-active agent supplied onto the fixed abrasive strongly adheres to the surfaces of the abrasive particles of the fixed abrasive and to the surface of the nitride film electrically. Since the abrasive particles of the fixed abrasive and the nitride film are both covered with the anionic surface-active agent they interact repulsively. Therefore, polishing of the nitride film is hard to proceed and a polishing rate of the nitride film becomes extremely low. The polishing selectivity is, for example, oxide film:nitride film=10 or higher: 1, and the nitride film acts as a polishing stopper. Since the polishing rate of the nitride film is extremely lowered and stock removal decreases, a resulting nitride film can be prevented from becoming uneven in terms of film thickness and within-wafer uniformity of the nitride film can be obtained.

At this point, it may be considered that because of the above-described polishing selectivity, the nitride film is not polished and only the silicon oxide film is polished, and the above-described dishing will proceed. In fact, however, dishing does not proceed, and depth of a dishing amount can be controlled, for example, within 100 Å or less. This is considered to be due to the following reasons:

① The anionic surface-active agent adheres not only to the surface of the nitride film, but also to the silicon oxide film in a small amount, whereby a coat of the anionic surface-active agent is formed on the surface of the silicon oxide film. When a surface pressure having at least a certain value is applied to the silicon oxide, a coat on the surface of the silicon oxide film breaks or becomes fragile, and therefore polishing of the silicon oxide film proceeds. As the polishing proceeds to a certain extent, however, a level of the surface of the silicon oxide film becomes lower than that of the nitride film. Accordingly, the surface pressure on the silicon oxide film decreases, and hence a thick coat of the anionic surface-active agent is formed on the silicon oxide film and progress of polishing is retarded.

② Since the anionic surface-active agent used here is a polymer, the anionic surface-active agent, which has adhered to the nitride film, covers part or a considerable area of a trench portion, and hence polishing of the silicon oxide film by the abrasive particles in the fixed abrasive is impeded.

Further, the present invention uses a fixed abrasive as a polishing surface. A fixed abrasive provides a hard polishing surface which hardly deforms elastically. Such a polishing surface, as compared to a conventional polishing pad having elasticity, is less likely to cause dishing and can provide a flatter finished surface. However, if a hard polishing pad which has a hardness equivalent to a fixed abrasive is used, then the polishing pad, a slurry, and a surface-active agent may be used.

Thus, according to the present invention, polishing of a workpiece is performed while supplying the polishing liquid which contains an anionic surface-active agent and does not contain abrasive particles, onto the fixed abrasive, whereby a nitride film, for example, is allowed to act as a polishing stopper. Accordingly, the polishing method of the present invention can lower a polishing rate of a nitride film to obtain within-wafer uniformity of the nitride film and can suppress dishing, thus enabling a high-flatness polishing with fewer scratches.

BRIEF DESCRIPTION OF DRAWINGS

FIG. 5 is a partial cross-sectional view of a substrate, showing a polishing procedure in which a fixed abrasive polishing process is applied to an STI forming process;

FIG. 6 is a partial cross-sectional view of a substrate, showing a polishing procedure in which a fixed abrasive polishing process is applied to a gate forming process;

FIG. 8 is a view showing a concentration adjusting facility disposed outside of a CMP apparatus;

DETAILED DESCRIPTION OF THE PREFERRED EMBODIMENTS

Figure 1:
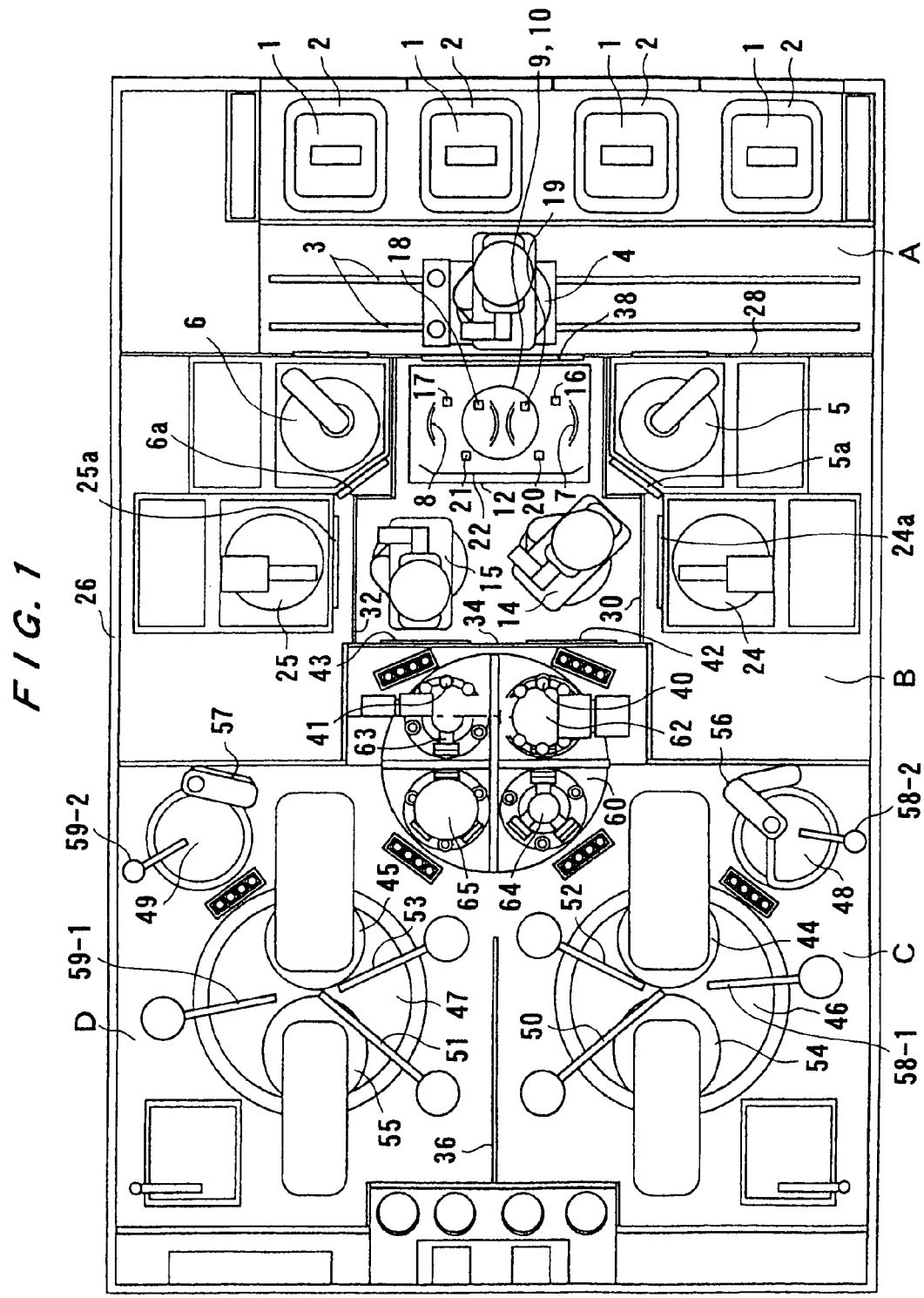
FIG. 1 is a plan view showing an overall construction of a polishing apparatus according to an embodiment of the present invention.

A polishing apparatus according to embodiments of the present invention will be described in detail below with reference to the drawings. FIG. 1 is a plan view showing an entire arrangement of a polishing apparatus according to an embodiment of the present invention.

As shown in FIG. 1, the polishing apparatus comprises four load/unload stages 2 each for receiving a wafer cassette 1 which accommodates a number of semiconductor wafers. The load/unload stages 2 may have a lifting and lowering mechanism. A transfer robot 4 is provided on rails 3 so that the transfer robot 4 can access respective wafer cassettes 1 on respective load/unload stages 2.

The transfer robot 4 has upper and lower hands. The lower hand of the transfer robot 4 is a vacuum attraction-type hand for holding a semiconductor wafer under vacuum, and is used only for removing a semiconductor wafer from a wafer cassette 1. The vacuum attraction-type hand can hold and transport the semiconductor wafer even if the semiconductor wafer is not located at a normal position in the wafer cassette due to a slight displacement. The upper hand of the transfer robot 4 is a recess support-type hand for supporting a peripheral edge of a wafer, and is used only for returning the semiconductor wafer to the wafer cassette 1. The recess support-type hand can transport the semiconductor wafer while keeping the semiconductor wafer clean because dust is not collected, unlike the vacuum attraction-type hand. In this manner, since a clean wafer which has been cleaned is held by the upper hand, the clean semiconductor wafer is not further contaminated.

Two cleaning units 5, 6 for cleaning a semiconductor wafer are disposed at an opposite side of the wafer cassettes 1 with respect to the rails 3 of the transfer robot 4. The cleaning units 5, 6 are disposed at positions accessible by the hands of the transfer robot 4. Each of the cleaning units 5, 6 has a spin-dry mechanism for drying a wafer by spinning the wafer at a high speed, and hence two-stage cleaning and three-stage cleaning of a wafer can be performed without replacing any cleaning module.

Between the two cleaning units 5 and 6, a wafer station 12 having four semiconductor wafer supports 7, 8, 9 and 10 is disposed at a position accessible by the transfer robot 4. A transfer robot 14 having two hands is disposed at a position where hands of the transfer robot 14 can access the cleaning unit 5 and the three supports 7, 9 and 10. A transfer robot 15 having two hands is disposed at a position where hands of the transfer robot 15 can access the cleaning unit 6 and the three supports 8, 9 and 10.

The support 7 is used to transfer a semiconductor wafer between the transfer robot 4 and the transfer robot 14, and the support 8 is used to transfer a semiconductor wafer between the transfer robot 4 and the transfer robot 15. These supports 7, 8 have sensors 16, 17 for detecting existence of a semiconductor wafer, respectively.

The support 9 is used to transfer a semiconductor wafer from the transfer robot 15 to the transfer robot 14, and the support 10 is used to transfer a semiconductor wafer from the transfer robot 14 to the transfer robot 15. These supports 9, 10 have sensors 18, 19 for detecting existence of a semiconductor wafer, and rinsing nozzles 20, 21 for preventing the semiconductor wafer from being dried, or for rinsing the wafer.

The supports 9 and 10 are disposed in a common water-scatter-prevention cover which has an opening defined therein for transferring wafers therethrough. At the opening, there is provided a shutter 22. The support 9 is disposed above the support 10. This upper support 9 serves to support a wafer which has been cleaned, and lower support 10 serves to support a wafer to be cleaned. With this arrangement, a wafer is prevented from being contaminated by rinsing liquid which would otherwise fall thereon. The sensors 16, 17, 18 and 19, the rinsing nozzles 20, 21, and the shutter 22 are schematically shown in FIG. 1, and their positions and shapes are not exactly illustrated.

A cleaning unit 24 is disposed at a position adjacent to the cleaning unit 5 and is accessible by the hands of the transfer robot 14. Further, a cleaning unit 25 is disposed at a position adjacent to the cleaning unit 6 and is accessible by hands of the transfer robot 15. These cleaning units 24 and 25 are capable of cleaning both surfaces of a wafer.

Respective upper hands of the transfer robot 14 and the transfer robot 15 are used for transporting a semiconductor wafer, that has been cleaned, to the cleaning units or the supports of the wafer station 12. On the other hand, respective lower hands of the transfer robot 14 and the transfer robot 15 are used for transporting a semiconductor wafer that has not been cleaned, or a semiconductor wafer to be polished. Since the lower hands are used to transfer a wafer to or from a reversing device (described later on), the upper hands are not contaminated by drops of rinsing liquid which fall from an upper wall of the reversing device.

As shown in FIG. 1, the cleaning units 5, 6, 24 and 25 have shutters 5a, 6a, 24a and 25a at respective wafer entrances for transferring wafers therethrough, respectively. The shutters 5a, 6a, 24a and 25a are opened only when wafers are transferred through the shutters 5a, 6a, 24a and 25a.

The polishing apparatus has a housing 26 for enclosing various components therein. An interior of the housing 26 is partitioned into a plurality of areas (including areas A and B) by partition walls 28, 30, 32, 34 and 36.

Area A in which the wafer cassettes 1 and the transfer robot 4 are disposed, and area B in which the cleaning units 5 and 6 and the supports 7, 8, 9 and 10 are disposed, are partitioned by the partition wall 28 so that cleanliness of area A and that of area B can be separated from each other. The partition wall 28 has an opening for transferring semiconductor wafers between area A and area B, and a shutter 38 is provided at the opening of the partition wall 28. All of the cleaning units 5, 6, 24 and 25, the supports 7, 8, 9 and 10 of the wafer station 12, and the transfer robots 14 and 15 are placed in area B. Pressure in area B is adjusted so as to be lower than pressure in area A.

As shown in FIG. 1, in area C separated from area B by the partition wall 34, a reversing device 40 for reversing a semiconductor wafer is provided at a position accessible by the hands of the transfer robot 14. The semiconductor wafer is transferred to the reversing device 40 by the transfer robot 14. Further, in area C, a reversing device 41 for reversing a semiconductor wafer is provided at a position accessible by the hands of the transfer robot 15. The semiconductor wafer is transferred to the reversing device 41 by the transfer robot 15. Each of the reversing devices 40 and 41 has a chuck mechanism for chucking a semiconductor wafer, a reversing mechanism for reversing the semiconductor wafer, and a detecting sensor for detecting whether or not the chuck mechanism chucks the semiconductor wafer.

The partition wall 34 forms a polishing chamber which is separated from area B. The polishing chamber is further divided into two areas C and D by the partition wall 36. The partition wall 34 between area B and areas C, D has openings for transferring semiconductor wafers therethrough. Shutters 42, 43 for the reversing devices 40, 41 are respectively provided at the openings of the partition wall 34.

As shown in FIG. 1, each of areas C and D has two polishing tables and one top ring for holding and pressing one semiconductor wafer against the polishing tables to polish the wafer. Specifically, area C has a top ring 44, polishing tables 46, 48, a polishing liquid supply nozzle 50 for supplying a polishing liquid onto the polishing table 46, an atomizer 52 having a plurality of ejection nozzles (not shown) connected to a nitrogen gas supply source and a liquid supply source, a dresser 54 for dressing the polishing table 46, and a dresser 56 for dressing the polishing table 48. Similarly, area D has a top ring 45, polishing tables 47, 49, a polishing liquid supply nozzle 51 for supplying a polishing liquid onto the polishing table 47, an atomizer 53 having a plurality of ejection nozzles (not shown) connected to a nitrogen gas supply source and a liquid supply source, a dresser 55 for dressing the polishing table 47, and a dresser 57 for dressing the polishing table 49. The polishing tables 48, 49 have, for example, Politex pads (Rodel) for buffing cleaning attached thereto, and have liquid supply nozzles 58-2, 59-2.

The polishing liquid supply nozzles 50, 51, 58-1, 59-1 supply polishing liquids, used for a polishing process, and dressing liquids (e.g., water) used for a dressing process, onto the polishing tables 46, 47, respectively. The atomizers 52, 53 eject liquids composed of a mixture of nitrogen gas with pure water or a chemical liquid onto the polishing tables 46, 47, respectively. Nitrogen gas from the nitrogen gas supply source and pure water or a chemical liquid from the liquid supply source are passed through a regulator or air operated valve (not shown) to regulate pressure thereof to a predetermined value, and supplied to the ejection nozzles in the atomizers 52, 53 in a mixed state. In this case, the liquid should preferably be ejected from the ejection nozzles of the atomizers 52, 53 toward outer peripheral edges of the polishing tables 46, 47. Other inert gases may be used instead of nitrogen gas. Further, the atomizers 52, 53 may eject only a liquid of pure water or a chemical liquid. The polishing tables 48, 49 may have atomizers as with the polishing tables 46, 47, respectively. With atomizers for the polishing tables 48, 49, surfaces of the polishing tables 48, 49 can be kept clean.

The mixture of nitrogen gas with pure water or the chemical liquid is supplied in a state of ① liquid fine particles, ② solid fine particles as a result of solidification of the liquid, or ③ gas as a result of vaporization of the liquid. These states ①, ② and ③ are referred to as atomization. In these states, the mixture is ejected from the ejection nozzles of the atomizers 52, 53 toward the polishing tables 46, 47. For example, pressure or temperature of the nitrogen gas and/or the pure water or the chemical liquid, or a shape of the nozzles determines which state of the mixed liquid is to be ejected, i.e., the liquid fine particles, the solid fine particles, or gas. Therefore, the state of the liquid to be ejected can be varied, for example, by properly adjusting pressure or temperature of the nitrogen gas and/or the pure water or the chemical liquid with use of a regulator or the like, or by properly adjusting the shape of the nozzles.

The polishing tables 48, 49 may be replaced with wet-type thickness measuring devices for measuring a thickness of a film formed on a wafer. With such wet-type thickness measuring devices, the thickness of a film formed on a wafer can be measured immediately after the wafer is polished, and hence it is possible to further polish this polished wafer or to control a polishing process for polishing a subsequent wafer based on measured results.

A rotary transporter 60 is disposed below the reversing devices 40 and 41 and the top rings 44 and 45 to transfer wafers between the cleaning chamber (area B) and the polishing chamber (areas C, D). The rotary transporter 60 has four stages for placing wafers W at equal angular intervals, and can hold a plurality of wafers thereon at the same time.

A wafer which has been transferred to the reversing device 40 or 41 is transferred to the rotary transporter 60 by elevating and lowering a lifter 62 or 63 disposed below the rotary transporter 60 when a center of a stage of the rotary transporter 60 is aligned with a center of the wafer held by the reversing device 40 or 41. A wafer placed on the stage of the rotary transporter 60 is transported to a position below the top ring 44 or the top ring 45 by rotating the rotary transporter 60 by an angle of 90°. At this time, the top ring 44 or the top ring 45 is positioned above the rotary transporter 60 beforehand by a swinging motion of the top ring. A wafer held on the stage of the rotary transporter 60 is transferred to the top ring 44 or 45 by elevating and lowering a pusher 64 or 65 disposed below the rotary transporter 60 when a center of the top ring 44 or 45 is aligned with a center of the wafer.

Figure 2:
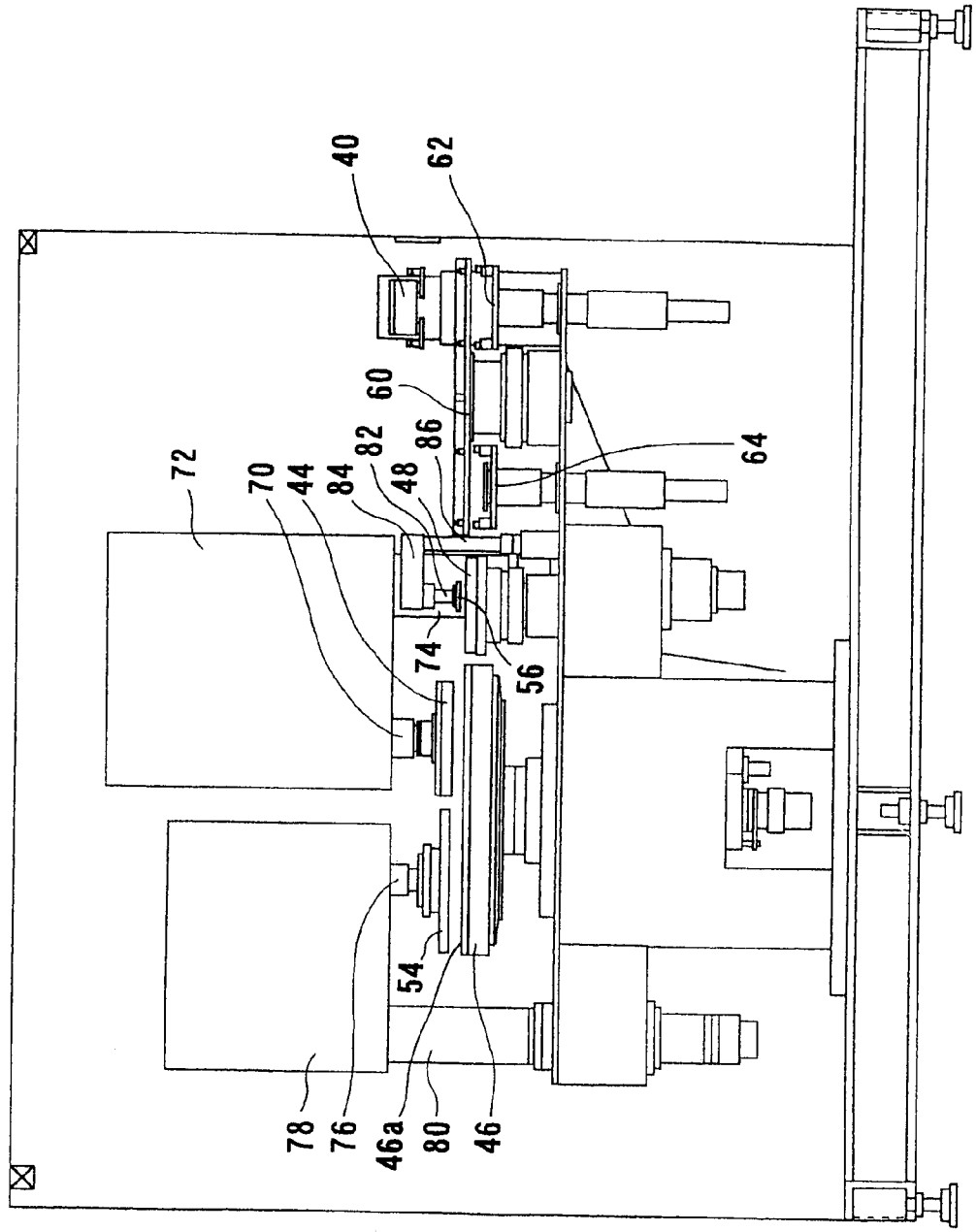
FIG. 2 is a front view of a polishing chamber of FIG. 1.
Figure 3A:
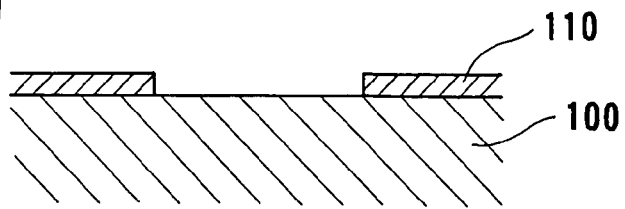
FIGS. 3A through 3F are schematic views showing an example of an STI forming process.
Figure 3B:
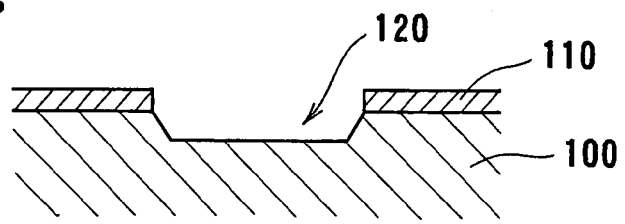
Figure 3C:
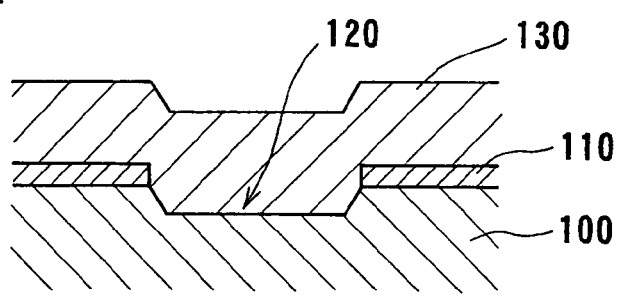
Figure 3D:
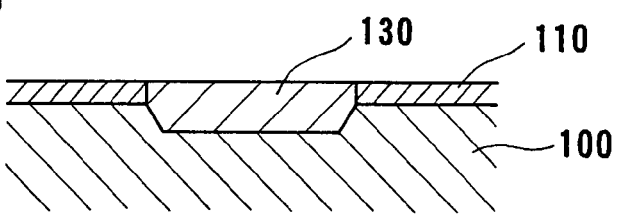
Figure 3E:
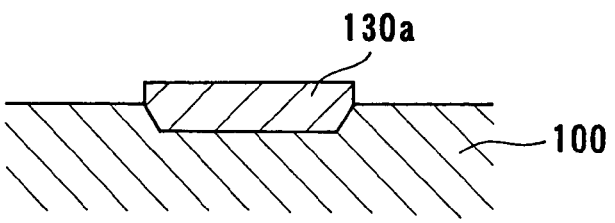
Figure 3F:
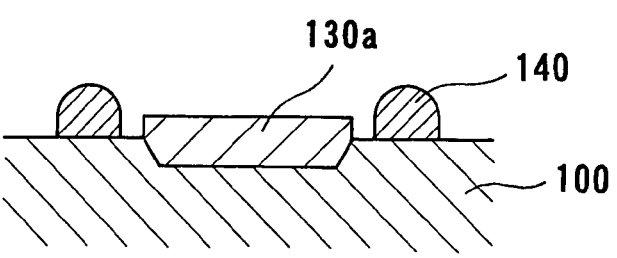
Figure 4:
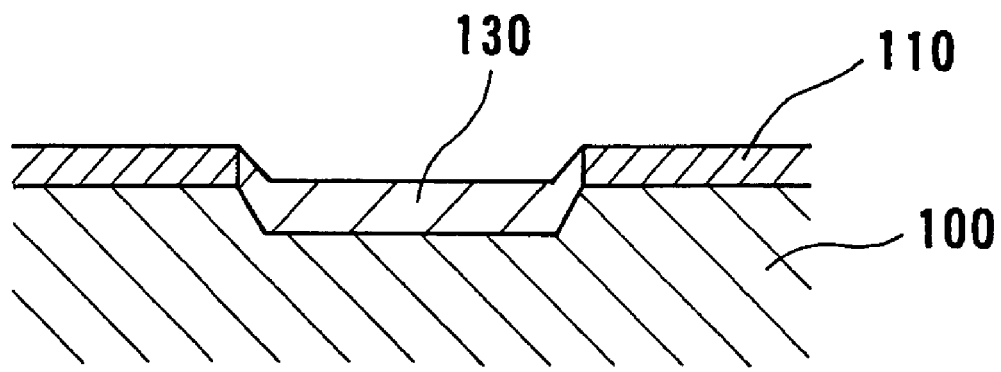
FIG. 4 is a schematic view showing dishing caused by a conventional polishing apparatus.

Next, the polishing chamber will be described below. Although only area C will be described below, the following description can be applied to area D. FIG. 2 shows a relationship between the top ring 44 and the polishing tables 46, 48 in area C.

As shown in FIG. 2, the top ring 44 is supported from a top ring head 72 by a top ring drive shaft 70 which is rotatable. The top ring head 72 is supported by a support shaft 74 which can angularly be positioned, and the top ring 44 can access the polishing tables 46 and 48.

The dresser 54 is supported from a dresser head 78 by a dresser drive shaft 76 which is rotatable. The dresser head 78 is supported by a support shaft 80 which can angularly be positioned, and the dresser 54 can be moved between a standby position and a dressing position above the polishing table 46. The dresser 56 is similarly supported from a dresser head 84 by a dresser drive shaft 82 which is rotatable. The dresser head 84 is supported by a support shaft 86 which can angularly be positioned, and the dresser 56 can be moved between a standby position and a dressing position above the polishing table 48. The dresser comprises one of a diamond dresser with diamond particles fixed to a metal or ceramic plate, a nylon brush, a ceramic plate with surface irregularities, a carbon fiber brush, a fixed abrasive material, a waterjet stream, a cavitation jet stream, an ultrasonic oscillator, ultraviolet rays, and a laser beam, or a combination of these.

The polishing table 46 has an upper surface composed of a fixed abrasive 46a having abrasive particles and pores or a pore agent, which are fixed by a binder (resin). The fixed abrasive 46a serves as a polishing surface for polishing a semiconductor wafer held by the top ring 44. Such a fixed abrasive 46a can be obtained, for example, by spray-drying a mixed liquid which is a mixture of a slurry of abrasive (dispersion of abrasive particles in a liquid) and a resin emulsion, filling this resulting mixed powder into a molding jig, and subjecting the mixed powder to a pressure/heat treatment. Ceria ($CeO_2$) or silica ($SiO_2$) having an average particle diameter of not more than 0.5 µm is preferably used as the abrasive particles. A thermoplastic resin or a thermosetting resin may be used as the binder. The thermoplastic resin is preferably used.

The polishing table 48 has an upper surface composed of a soft nonwoven fabric. The nonwoven fabric serves as a cleaning surface for cleaning a semiconductor wafer after a polishing process to remove abrasive particles attached to a surface of the semiconductor wafer.

Next, a polishing process for polishing a semiconductor wafer with use of a polishing apparatus according to the present invention will be described below. Although a polishing process only in area C will be described below, the following description can be applied to a polishing process in area D. Further, though the following description illustrates application of the present invention to a polishing step in an STI formation, the present invention is also applicable, for example, to polishing of a semiconductor wafer having a pattern of interlayer dielectrics (ILD).

For example, in a case of a low pattern density or a film (such as a BPSG film) which is liable to be easily polished, a silicon oxide film in a trench tends to develop dishing because a nitride film can be reached by polishing in a short period of time. In this case, an ex-situ dressing process (described below) is employed.

1) Ex-Situ Dressing Process

The polishing table 46 and the dresser 54 are rotated about their own axes, respectively, and the dresser 54 is pressed against the polishing table 46 to dress the fixed abrasive 46a.

At this time, the atomizer 52 ejects a mixture of DIW (pure water) and nitrogen gas to the fixed abrasive 46a.

2) Polishing Process

While the polishing table 46 and the top ring 44 are rotated about their own axes, respectively, a semiconductor wafer is pressed against the polishing table 46 to thereby polish a silicon oxide film on the semiconductor wafer until the fixed abrasive reaches a nitride film. During this polishing, a polishing liquid which contains an anionic surface-active agent and does not contain abrasive particles is supplied from the polishing liquid supply nozzle 50 onto the fixed abrasive 46a. A concentration of the anionic surface-active agent is preferably 0.001% by weight to 5% by weight.

A pH of the polishing liquid is preferably in a range of from 5 to 10.

The anionic surface-active agent preferably contains an organic compound having a hydrophilic group which is either a $COO^-$ group or a $SO_3^-$ group.

In this manner, by polishing a substrate while supplying a polishing liquid which contains an anionic surface-active agent and does not contain abrasive particles, it becomes possible to allow a nitride film to act as a stopper, as described above. Accordingly, a polishing rate of the nitride film can be lowered to thereby obtain within-wafer uniformity of the nitride film and dishing of an oxide film can be suppressed. A high-flatness polishing with fewer scratches can thus be effected.

3) Water-Polishing Process

After the polishing process, the polishing table 46 and the top ring 44 are rotated about their own axes, respectively, and the semiconductor wafer is pressed against the polishing table 46 for water-polishing. At this time, the polishing liquid supply nozzle 50 supplies a polishing liquid or DIW to the fixed abrasive 46a. A pressing force applied to the wafer during this process is smaller than a pressing force applied to the wafer during the preceding polishing process.

As described above, when a semiconductor wafer which is liable to be easily polished and has a high polishing rate is polished, the above ex-situ polishing process is employed. If a high pattern density or a film which is less susceptible to being polished is involved, then since the film is hardly polished, an in-situ dressing process (described below) is employed for an increased polishing rate. Parts which are identical to those described above will not be described in detail below.

1) In-Situ Dressing Process

The polishing table 46, the dresser 54, and the top ring 44 are rotated about their own axes, respectively, and a semiconductor wafer is polished while the fixed abrasive 46a is being dressed. At this time, the polishing liquid supply nozzle 50 supplies pure water or an alkaline liquid to the fixed abrasive 46a, and the atomizer 52 ejects a mixture of DIW and nitrogen gas to the fixed abrasive 46a. Thereafter, when a thickness of a silicon oxide film on a nitride film becomes equal to or less than 1000 Å, for example, the dresser 54 stops dressing the fixed abrasive 46a, and the semiconductor wafer is continuously polished. At this time, the polishing liquid supply nozzle 50 supplies a polishing liquid which contains an anionic surface-active agent and does not contain abrasive particles. Specifically, the semiconductor wafer is polished, while the fixed abrasive 46a is being dressed, up to a time immediately before the nitride film on the semiconductor wafer is reached (until a remaining thickness of the silicon oxide film on the nitride film becomes about 1000 Å) (in-situ dressing). Thereafter, dressing of the fixed abrasive is stopped, and the semiconductor wafer is continuously polished until the nitride film is reached. In this manner, the nitride film acts as a polishing stopper, as described above. Therefore, a polishing rate of the nitride film is lowered to achieve within-wafer uniformity on the nitride film and also to prevent dishing. The semiconductor wafer is thus polished for high planarity with few scratches thereon.

2) Water-Polishing Process

After the polishing process, the polishing table 46 and the top ring 44 are rotated about their own axes, respectively, and the semiconductor wafer is pressed against the polishing table 46 for water-polishing. At this time, the polishing liquid supply nozzle 50 supplies a polishing liquid or DIW to the fixed abrasive 46a. A pressing force applied to the wafer during this process is smaller than the pressing force applied to the wafer during the preceding polishing process.

In the above example, the semiconductor wafer is polished while a polishing liquid which contains an anionic surface-active agent and does not contain abrasive particles is being supplied to the fixed abrasive 46a, and the nitride film acts as a polishing stopper. If the nitride film needs to be polished, then the semiconductor wafer may continuously be polished while a polishing liquid which contains a cationic surface-active agent and does not contain abrasive particles is being supplied to the fixed abrasive 46a. The cationic surface-active agent should preferably comprise at least one organic compound having any one structure of aliphatic amine salt, aliphatic quaternary ammonium salt, benzalkonium salt, benzethonium chloride, pyridinium salt, or imidazolium salt.

According to the present invention, since polishing selectivity (a ratio between polishing rates of the nitride film and the oxide film) of the polishing liquid which contains the anionic surface-active agent is increased at a time when the nitride film and the oxide film are simultaneously exposed on the surface being polished, it is effective to add the polishing liquid according to the present invention at a latter stage of the polishing process. The polishing liquid may be switched to the polishing liquid which contains the anionic surface-active agent at, or immediately prior to, a time when part of the nitride film starts being exposed. Before that time (while only the oxide film is being polished), the semiconductor wafer is polished while a polishing liquid containing a low concentration anionic surface-active agent or pure water is being supplied.

Then, the timing of supply of the polishing liquid which contains the anionic surface-active agent, and the timing of supply of the polishing liquid which contains the cationic surface-active agent will be described in detail below.

The polishing process according to the present invention which employs the fixed abrasive has better planarizing characteristics than the conventional CMP process, and requirements for improving planarizing characteristics in the STI forming process and the metal gate forming process are very high.

FIG. 5 shows a polishing sequence in which a fixed abrasive polishing process is applied to an STI forming process. A purpose for polishing an STI forming wafer is to remove a silicon oxide film 130 covering a silicon nitride film 110 to expose the silicon nitride film 110 (first and second polishing steps). Usually, the polishing process is finished when the silicon nitride film is exposed. However, the polishing process may be continued until the silicon nitride film 110 is polished to a predetermined film thickness (third polishing step).

A goal to be achieved at a time when the second polishing step is finished is to suppress dishing of a trench 120 to minimize irregularities of a remaining film thickness of the silicon nitride film 110. If the polishing is performed using pure water, then dishing of the silicon oxide film 130 in the trench 120 progresses, and the silicon nitride film 110 is gradually polished, resulting in increased irregularities of the remaining film thickness thereof. In order to suppress such dishing, the second polishing step is performed while a polishing liquid containing an anionic surface-active agent that is diluted to a predetermined concentration is being supplied. If such a polishing liquid is used, then the silicon nitride film 110 is not substantially polished, and hence serves as a stopper for stopping the polishing process. Therefore, irregularities of the remaining film thickness of the silicon nitride film 110 can be suppressed to a low level. For reasons described above, dishing of the silicon oxide film 130 in the trench 120 can also be reduced.

When the above polishing liquid is used, a polishing rate of the silicon oxide film 130 is also lowered. If the silicon oxide film 130 is polished while a polishing liquid containing an anionic surface-active agent, that is diluted to a predetermined concentration, is being supplied from the beginning of the first polishing step, then since a polishing time is increased, productivity is lowered. In the first polishing step, because only the silicon oxide film 130 is polished (the silicon nitride film 110 is not polished), it is basically unnecessary to add the polishing liquid containing the anionic surface-active agent. However, if the anionic surface-active agent is added, then even though the anionic surface-active agent is of a low concentration, the anionic surface-active agent is deposited in concavities of a non-flat surface (uneven surface) of the silicon oxide film 130 and protects concavities from polishing, thus improving planarizing characteristics. The anionic surface-active agent is also effective to increase dispersion of the abrasive particles which contribute to the polishing process. The anionic surface-active agent of a low concentration does not essentially lower the polishing rate of the silicon oxide film 130.

As described above, in the second polishing step, the polishing rate is lowered and the polishing time is correspondingly increased. Therefore, it is desirable to shorten the polishing time in the first polishing step as much as possible. Consequently, it is preferable in the first polishing step to supply the polishing liquid whose concentration of the anionic surface-active agent is as low as possible (at least lower than the concentration used in the second polishing step), to polish the silicon oxide film 130 at an increased polishing rate, and to polish the silicon oxide film 130 down to a position as close to the silicon nitride film 110 as possible. The first polishing step is switched to the second polishing step on the basis of time, or by detecting a table torque current change or detecting the remaining film thickness of the silicon oxide film 130. From a standpoint of making the remaining film thickness of the silicon oxide film 130 on the silicon nitride film 110 as small as possible, a goal to be achieved by the first polishing step should preferably be at least a planarized surface, or more preferably be the remaining film thickness of the silicon oxide film 130 smaller than 100 nm or preferably 50 nm. An endpoint of each of the polishing steps is detected by one of a process of detecting a processing endpoint based on a change in a torque current of a table drive motor for the polishing table, a process of applying light to the wafer and detecting intensity of reflected light to read a change in the film thickness of the silicon oxide film 130 or the silicon nitride film 110, and a process of applying light to the wafer and reading a change in optical reflectance of material of the surface being polished to detect the endpoint, or a combination of these.

If the silicon nitride film 110 needs to be polished to a predetermined film thickness, then it may be polished by adding a certain cationic surface-active agent that has been adjusted to a predetermined concentration. When a cationic surface-active agent is added, though an overall polishing rate is relatively low, the silicon oxide film 130 and the silicon nitride film 110 can be polished at substantially the same polishing rate. Since the polishing rate is low, the silicon nitride film 110 can be polished while reducing film thickness variations thereof. Since the polishing rates of the silicon oxide film 130 and the silicon nitride film 110 are approximately the same as each other, the silicon oxide film 130 is prevented from being excessively polished, i.e., from developing dishing. However, as described above, the process of polishing an STI wafer may be finished in the second polishing step. The third polishing step is required if the CMP process is applied to a gate forming process, for example, as shown in FIG. 6. In the gate forming process, the silicon nitride film 110 and the silicon oxide film 130 need to be polished simultaneously because the silicon nitride film 110 directly above the gate has to be completely removed to expose a lower layer. Therefore, it is necessary to perform an entire polishing process through the first and second polishing steps until the final third polishing step.

The three steps may be performed on a single polishing table or may be performed on respective tables. The polishing liquid may be supplied from respective polishing liquid supply nozzles in the respective three steps or may be supplied from a single polishing liquid supply nozzle in the three steps. For example, if a workpiece is polished for a purpose of forming an STI, then the first and second steps may be performed on a single polishing table or may be performed on respective tables. If the polishing process needs to be performed up to the third step, then the second and third steps should preferably be performed on respective tables for a reason that different surface-active agents are used in these steps. It takes a certain amount of time to clean away the anionic surface-active agent that remains on the surface of the fixed abrasive after the second step and to replace it with the cationic surface-active agent to be used in the third polishing step. In order to prevent productivity from being lowered due to increased replacing time, it is desirable to use a table in the third step which is different from the table used in the second step.

For the above reasons, it is preferable in the first polishing step to increase the polishing rate (so as to be faster than at least the polishing rate in the second step) for a necessity of shortening a polishing time. The concentration of the anionic surface-active agent that is contained in the polishing liquid used in the first polishing step should preferably be lower than the concentration of the anionic surface-active agent used in the second polishing step. The polishing liquid may be pure water. For increasing the polishing rate in the first polishing step, it is generally effective to make the polishing surface pressure higher, make the relative speed higher, or make a degree of dressing (conditioning) of the fixed abrasive higher than those in the second polishing step. The degree of dressing may be heightened by increasing the dressing time, increasing the pressing force of the dresser, applying light at an increased intensity, or increasing irradiation time of light. However, attention should be paid to the fact that depending on the type of the fixed abrasive, the polishing rate may be lowered if the relative speed is increased to a certain value. The dressing (conditioning) mechanism is not limited to the illustrated mechanism, but may be any of various other mechanisms.

According to the polishing process using the fixed abrasive, the polishing abrasive particles used for polishing is supplied from the fixed abrasive (pad) itself. The abrasive particles are generally liberated from the fixed abrasive (pad) itself due to a load applied during the polishing process or sliding friction caused during the polishing process. If this liberation of the abrasive particles is weak, then the fixed abrasive surface is dressed (conditioned) to promote liberation of the abrasive particles. Abrasive particles that are thus separated from the fixed abrasive include larger particles that are loosely joined into agglomerates or are firmly joined into agglomerates. These larger particles are a major factor in damaging a wafer surface. These larger particles can effectively be removed from the fixed abrasive by ejecting a pressurized fluid (atomizer) comprising a mixture of a gas and a liquid to the surface of the fixed abrasive during or after the dressing. The gas used in the atomizer should preferably be an inert gas such as a nitrogen gas. The liquid used in the atomizer may usually be pure water, but may be a chemical liquid containing an anionic surface-active agent for a purpose of dispersing agglomerated abrasive particles made up of abrasive particles that are loosely joined together. These means should preferably be used in the first polishing step, but may also be used in the second or third polishing step. The liquid used in the second polishing step may comprise an anionic surface-active agent adjusted to a predetermined concentration, and the liquid used in the third polishing step may comprise a cationic surface-active agent adjusted to a predetermined concentration.

The semiconductor wafer which has thus been polished by the fixed abrasive 46*a* in the in-situ or ex-situ dressing process is moved to the smaller-diameter table 48, on which the semiconductor wafer is subjected to buff cleaning. Specifically, while the top ring 44 and the polishing table 48 are being rotated independently of each other, the polished semiconductor wafer held by the top ring 44 is pressed against a soft non-woven cloth on the polishing table 48. At this time, the non-woven cloth is supplied with an abrasive-free liquid, e.g., pure water or an alkaline liquid, preferably an alkaline liquid of pH 9 or higher or an alkaline liquid containing TMAH, from the cleaning liquid supply nozzle 58-2. In this manner, abrasive particles that have been attached to the surface of the polished semiconductor wafer can effectively be removed therefrom.

Instead of the buff cleaning or in addition to the buff cleaning, the semiconductor wafer may be cleaned with DHF by the cleaning unit 24 or 25. Alternatively, abrasive particles attached to the surface of the polished semiconductor wafer may effectively be removed by cleaning the wafer surface with a roll brush while diluted hydrofluoric acid (DHF) is being added. Since diluted hydrofluoric acid (DHF) acts to etch the silicon oxide film 130 on the wafer surface, it can completely remove the abrasive particles attached to the wafer surface together with the silicon oxide film 130 therebeneath. After the above buff cleaning or DHF cleaning, the surface of the semiconductor wafer may be cleaned by, for example, a pen-shaped sponge member. Furthermore, a finish-polishing of the semiconductor wafer may be performed after the semiconductor wafer has been polished by the fixed abrasive 46*a*. The finish-polishing of the semiconductor wafer may be performed on the polishing table 46 or the polishing table 48. In either case, the finish-polishing of the semiconductor wafer is performed using a polishing liquid containing abrasive particles, and after the finish-polishing, the above water-polishing process and the cleaning process (buff cleaning or DHF cleaning) are performed.

Figure 7A:
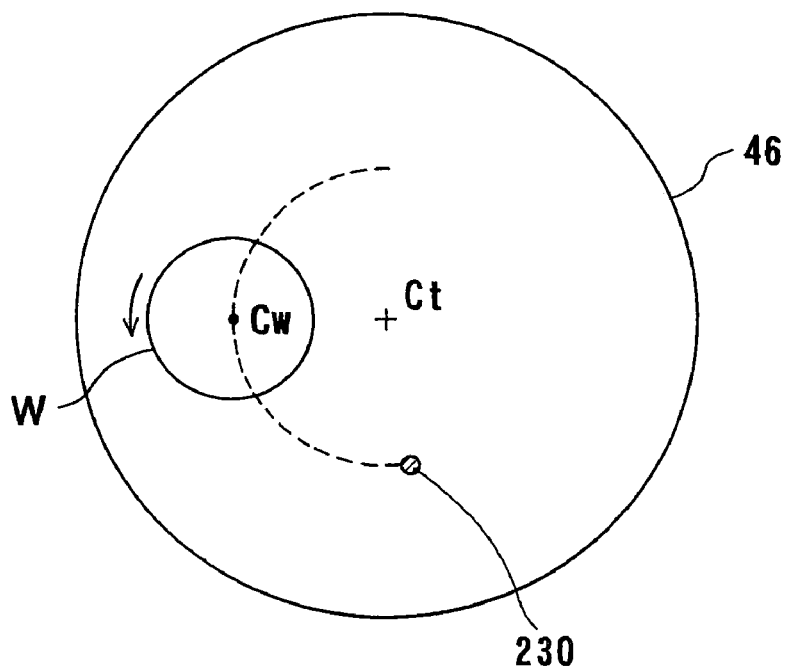
FIGS. 7A and 7B are views showing a polishing apparatus according to another embodiment of the present invention, with FIG. 7A being a plan view of a polishing table of the polishing apparatus and FIG. 7B being a cross-sectional view of the polishing apparatus.
Figure 7B:
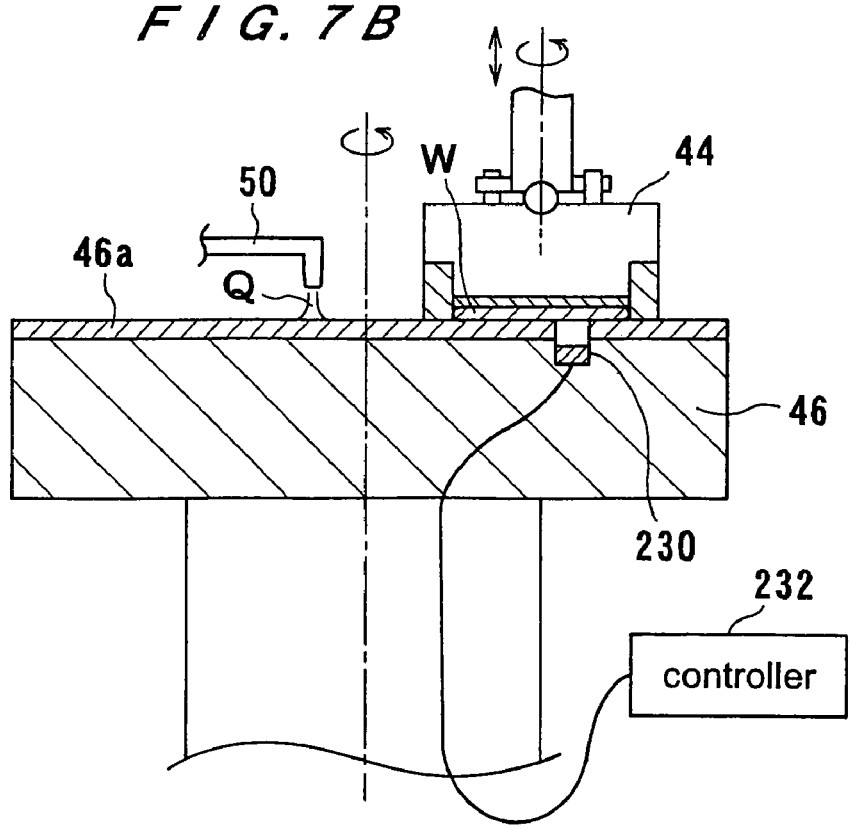

FIGS. 7A and 7B are views showing a polishing apparatus according to another embodiment of the present invention, FIG. 7A being a plan view of a polishing table of the polishing apparatus and FIG. 7B being a cross-sectional view of the polishing apparatus.

As shown in FIGS. 7A and 7B, the polishing apparatus according to the present embodiment has an optical sensor 230 disposed in polishing table 46. As shown in FIG. 7B, the optical sensor 230 comprises a light-emitting element and a light-detecting element. The light-emitting element applies light to a surface, being polished, of a semiconductor wafer, and the light-detecting element detects light reflected from the surface being polished. The light emitted from the light-emitting element comprises either a laser beam or an LED light beam. When a silicon oxide film or a silicon nitride film is polished to a predetermined film thickness, part of the light applied from the light-emitting element to the surface, being polished, of the semiconductor wafer passes through the film, and is reflected from a film beneath the film being polished. Therefore, there are two types of light reflected from the semiconductor wafer, i.e., light reflected from the film beneath the film being polished, and light reflected from the surface of the film being polished. The light-detecting element detects these two types of reflected light, and outputs a signal to a controller 232. The controller 232 processes this supplied signal to accurately detect a film thickness of a remaining silicon oxide film or silicon nitride film.

A polishing liquid supply apparatus and a polishing apparatus having such polishing liquid supply apparatus according to the present invention will be described below.

FIG. 8 is a view showing a concentration adjusting facility 160 disposed outside of a CMP apparatus.

The polishing liquid supply apparatus according to the present invention has a raw liquid container 161 which contains a surface-active agent having a predetermined concentration. According to the present invention, the surface-active agent is diluted for use. The surface-active agent is diluted near or within the polishing apparatus, so that the raw liquid container 161 may be small in size. The raw liquid container 161 supplies raw liquid to concentration adjustment containers 164, 166 respectively by pumps 162, 163 having a flow rate adjusting function. The concentration adjustment containers 164, 166 are supplied with pure water at flow rates adjusted respectively by flow rate controllers 168, 169 for achieving predetermined surface-active agent concentrations, respectively. For example, if an anionic surface-active agent which is of a very low concentration is used in a first polishing step and an anionic surface-active agent which is of a concentration higher than that in the first polishing step is used in a second polishing step, then two surface-active agents having different concentrations can be prepared from the raw liquid supplied from common raw liquid container 161 as in the present embodiment. The surface-active agents thus prepared are supplied through respective lines 1, 2 to the CMP apparatus. However, the surface-active agents may be supplied to the CMP apparatus through a single supply line having a selector valve.

Figure 9:
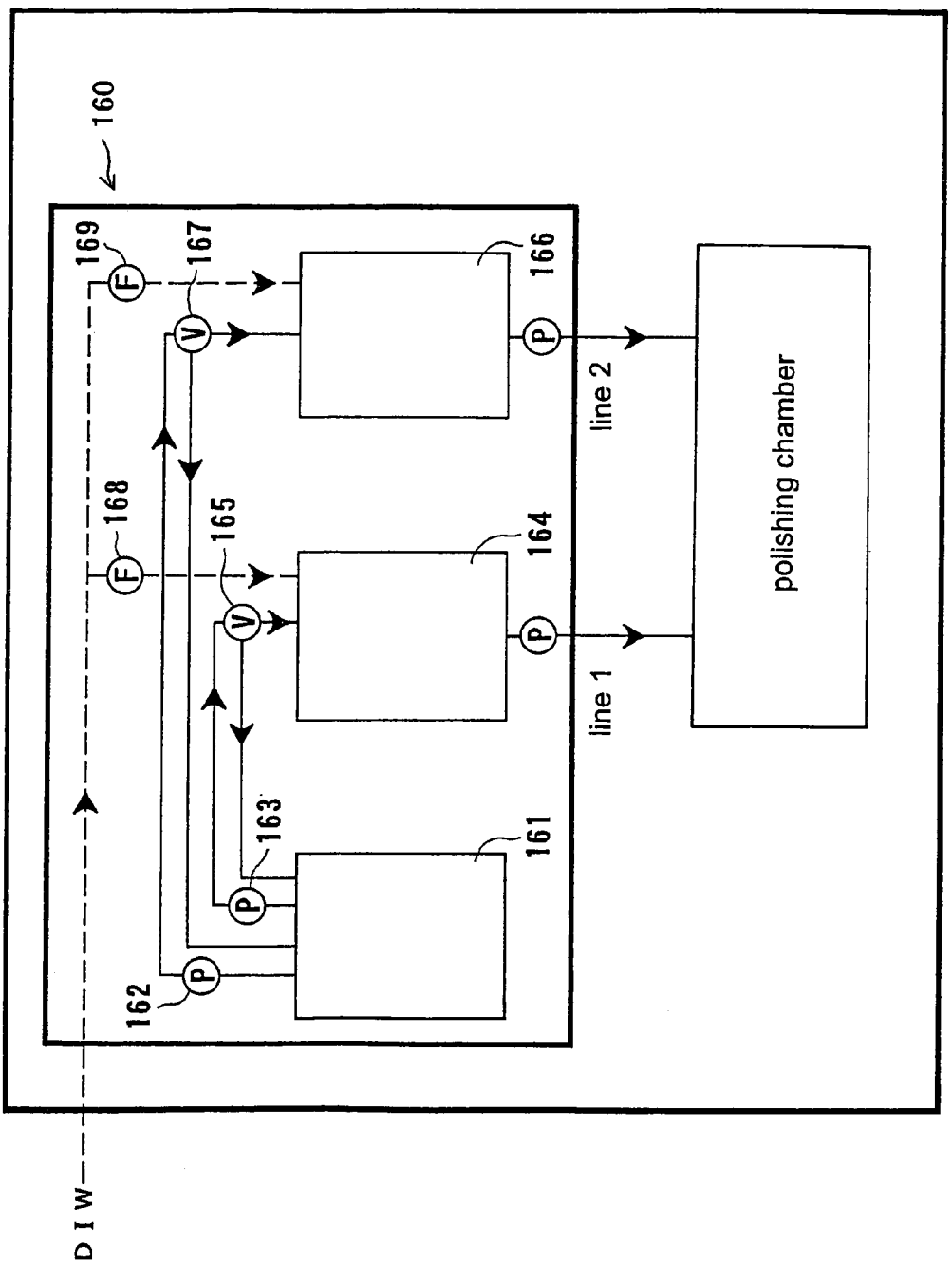
FIG. 9 is a view showing a concentration adjusting facility disposed within a CMP apparatus.

FIG. 9 is a view showing a concentration adjusting facility 160 disposed within a CMP apparatus. In FIG. 9, a surface-active agent concentration adjusting mechanism is disposed within the CMP apparatus. The surface-active agent concentration adjusting mechanism shown in FIG. 9 is identical to that shown in FIG. 8, and will not be described in detail below.

Figure 10:
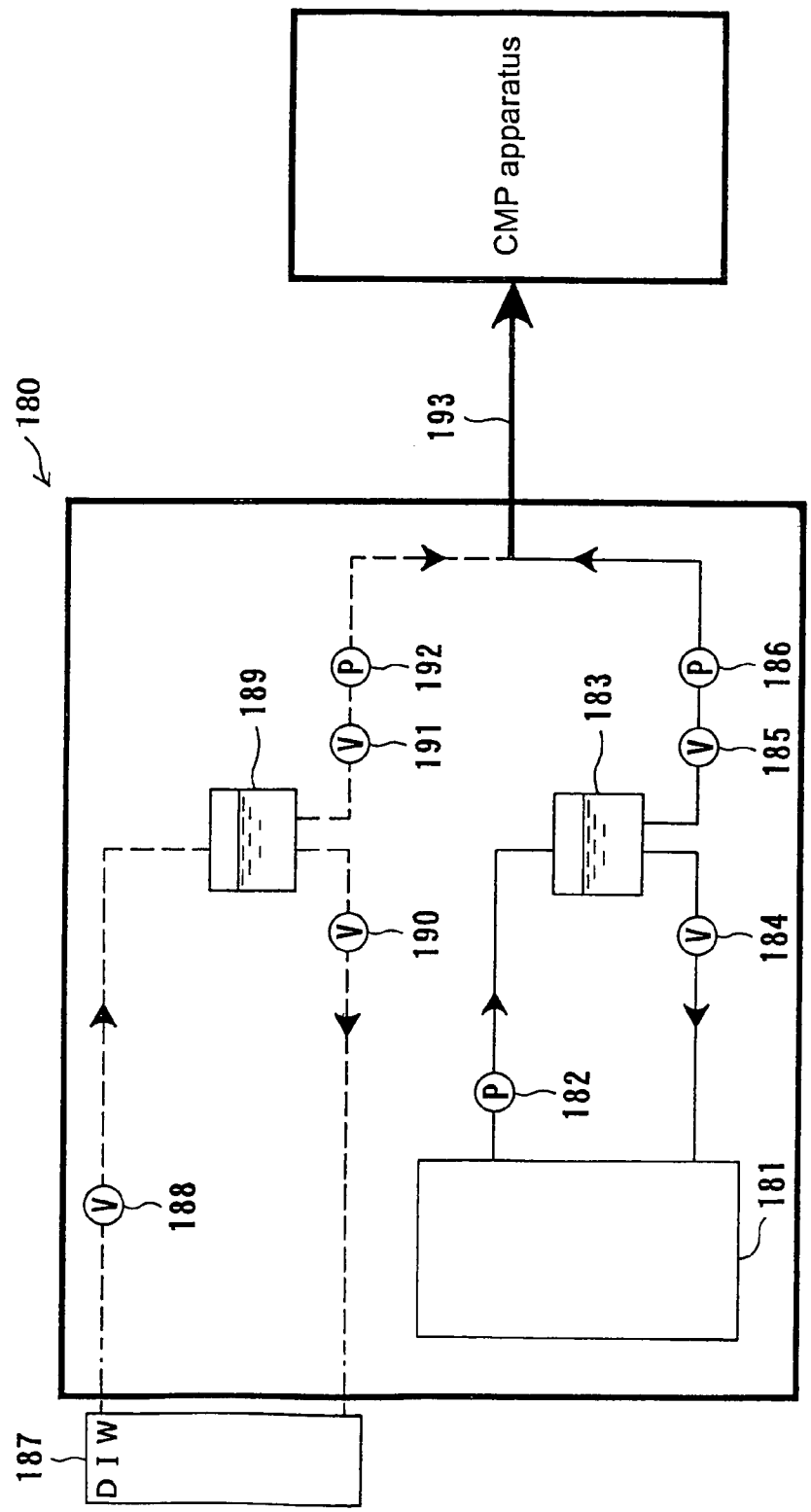
FIG. 10 is a view showing a concentration adjusting facility disposed outside of a CMP apparatus according to another embodiment of the present invention.

FIG. 10 is a view showing a concentration adjusting facility 180 disposed outside of a CMP apparatus. As shown in FIG. 10, a raw liquid container 181 is connected to a mixing pipe 193 through a pump 182 for drawing a raw liquid from the raw liquid container 181, a raw liquid buffer container 183, a circulation line valve 184, a discharge valve 185, and a pump 186 having a discharge flow rate adjusting function. A pure water supply line has a pure water supply source 187, a valve 188, a pure water buffer container 189, a circulation line valve 190, a discharge valve 191, and a pump 192 having a discharge flow rate adjusting function, and is connected to the mixing pipe 193. The raw liquid buffer container 183 and the pure water buffer container 189 are capable of keeping a flow rate and a pressure of the liquid in the mixing pipe 193 constant to adjust a surface-active agent to a desired concentration even when pressure in the raw liquid container changes and pressure in the pure water supply source 187 is high.

Figure 11:
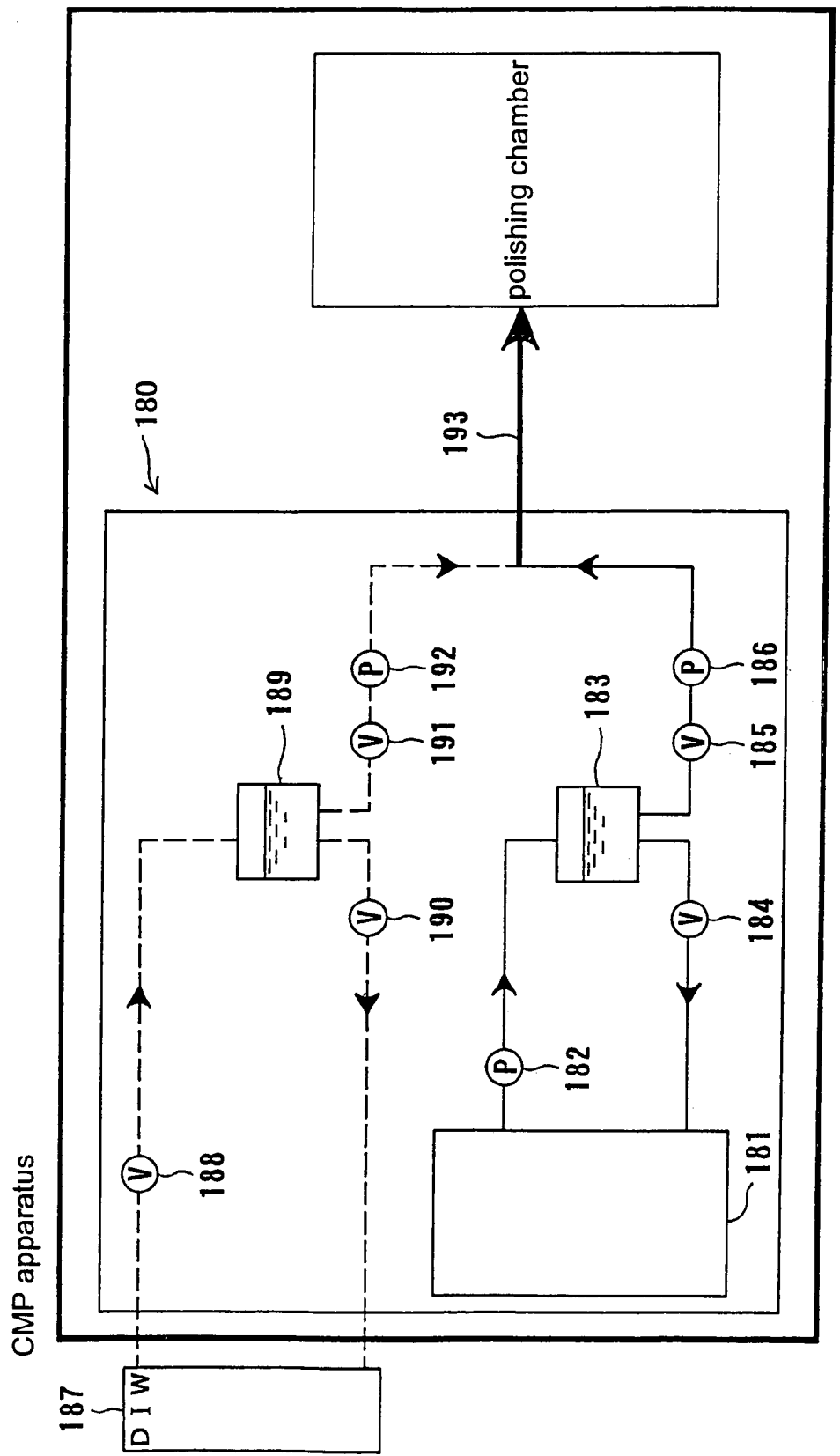
FIG. 11 is a view showing a concentration adjusting facility disposed within a CMP apparatus according to another embodiment of the present invention.

FIG. 11 is a view showing a concentration adjusting facility disposed within a CMP apparatus. The concentration adjusting facility shown in FIG. 11 is identical to the concentration adjusting facility shown in FIG. 10, and will not be described in detail below.

Figure 12:
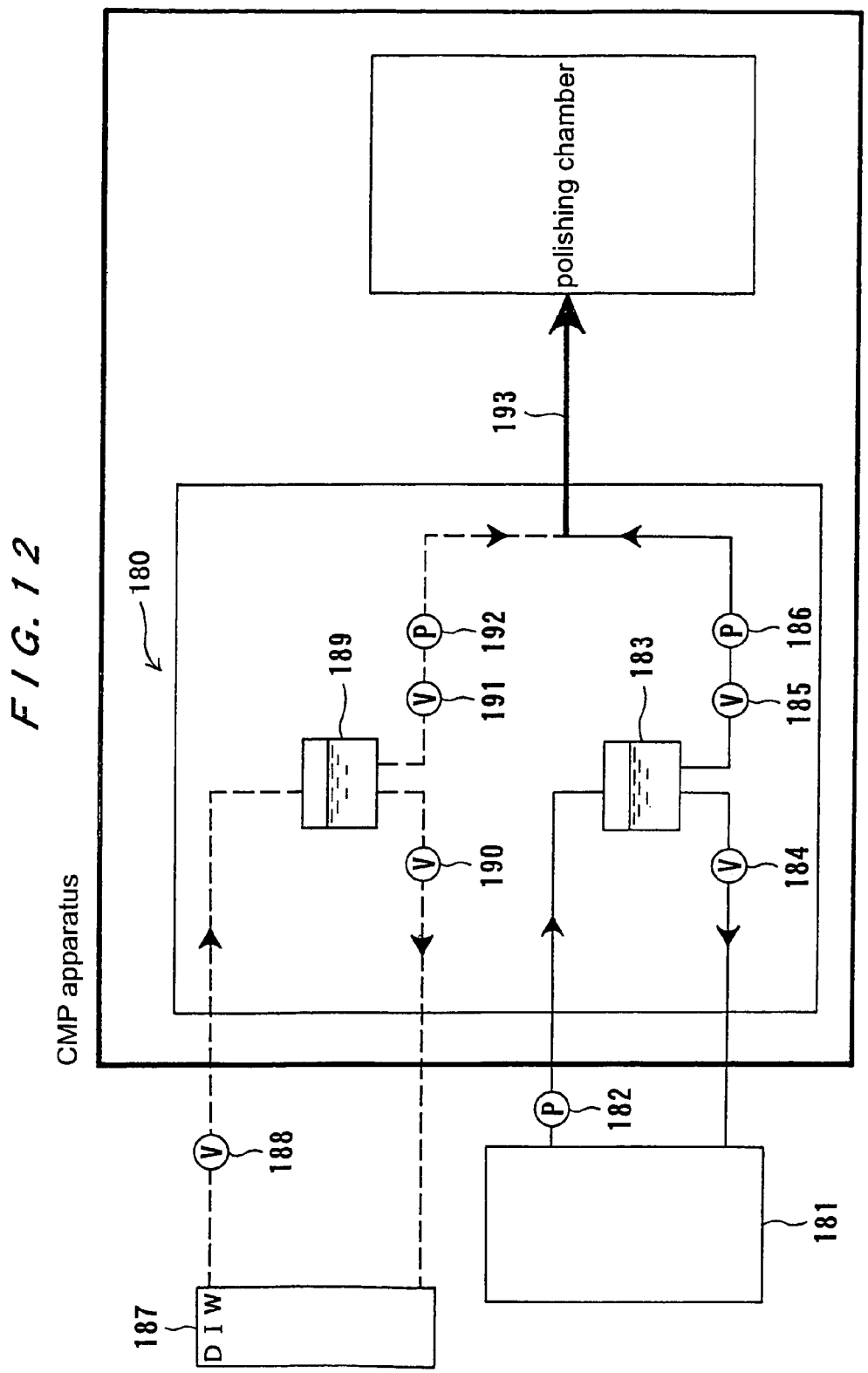
FIG. 12 is a view showing an example of a layout of a raw liquid solution and a pure water supply source disposed outside of a CMP apparatus, and other equipment disposed within the CMP apparatus.

FIG. 12 is a view showing an example of a layout of a raw liquid solution 181 and a pure water supply source 187 disposed outside of a CMP apparatus, and other equipment disposed within the CMP apparatus. Other structural details shown in FIG. 12 are identical to those shown in FIGS. 10 and 11.

If two chemical liquids, e.g., an anionic surface-active agent and a cationic surface-active agent, are used, then a plurality of polishing liquid concentration adjusting mechanisms are provided. However, a pure water supply source for supplying a diluent may be shared by the polishing liquid concentration adjusting mechanisms.

Although certain embodiments of the present invention have been described above, the present invention is not limited to the above embodiments, but may be reduced to practice in various different forms within the scope of the technical concept thereof.

As described above, according to the present invention, polishing of a workpiece is performed while supplying polishing liquid, which contains an anionic surface-active agent and does not contain abrasive particles, onto a fixed abrasive, whereby a nitride film, for example, is allowed to act as a polishing stopper. Accordingly, a polishing method of the present invention can lower a polishing rate of a nitride film to obtain within-wafer uniformity of the nitride film and can suppress dishing, thus enabling high-flatness polishing with fewer scratches.

INDUSTRIAL APPLICABILITY

The present invention is preferably applicable to a polishing method and apparatus for polishing a workpiece such as a semiconductor wafer using a fixed abrasive.

The invention claimed is:

1. A method for polishing a workpiece, comprising:
pressing a workpiece, having a nitride film and an oxide film formed on said nitride film, against a polishing surface and bringing said workpiece into sliding contact with said polishing surface while supplying a polishing liquid containing an anionic surface-active agent, thereby polishing said oxide film until a portion of said oxide film is removed so as to expose a surface of said nitride film; and then
pressing said workpiece against a polishing surface and bringing said workpiece into sliding contact with said polishing surface while supplying a polishing liquid containing a cationic surface-active agent, thereby polishing said nitride film and a remaining portion of said oxide film at substantially the same rate.

2. The method according to claim 1, wherein
pressing said workpiece against said polishing surface and bringing said workpiece into sliding contact with said polishing surface while supplying a polishing liquid containing a cationic surface-active agent comprises pressing said workpiece against said polishing surface and bringing said workpiece into sliding contact with said polishing surface while supplying a polishing liquid containing a cationic surface-active agent that contains at least one organic compound having any one structure of aliphatic amine salt, aliphatic quaternary ammonium salt, benzalkonium salt, benzethonium chloride, pyridinium salt, or imidazolium salt.

3. The method according to claim 1, wherein
pressing said workpiece against a polishing surface and bringing said workpiece into sliding contact with said polishing surface while supplying a polishing liquid containing an anionic surface-active agent comprises pressing said workpiece against said polishing surface and bringing said workpiece into sliding contact with said polishing surface while supplying a polishing liquid containing an anionic surface-active agent that contains an organic compound having a hydrophilic group selected from COO— group and $SO_3$— group.

4. A method for polishing a workpiece, comprising:
pressing a workpiece, having a non-flat upper layer composed of a silicon oxide film and a lower layer composed partly of a silicon nitride film, against a polishing surface and bringing said workpiece into sliding contact with said polishing surface while supplying a first polishing liquid containing an anionic surface-active agent or pure water, thereby polishing said upper layer until said upper layer becomes planarized over an entire surface of said workpiece; then
pressing said workpiece against a polishing surface and bringing said workpiece into sliding contact with said polishing surface while supplying a second polishing liquid containing an anionic surface-active agent, thereby polishing the planarized upper layer until a portion of said silicon oxide film is removed to expose substantially an entire surface of said silicon nitride film; and
pressing said workpiece against a polishing surface and bringing said workpiece into sliding contact with said polishing surface while supplying a third polishing liquid containing a cationic surface-active agent and not containing abrasive particles, thereby polishing said silicon nitride film to a predetermined thickness.

5. The method according to claim 4, wherein
pressing a workpiece against a polishing surface and bringing said workpiece into sliding contact with said polishing surface while supplying a first polishing liquid comprises pressing said workpiece against a fixed abrasive and bringing said workpiece into sliding contact with said fixed abrasive while supplying a first polishing liquid that does not contain abrasive particles, and
pressing said workpiece against a polishing surface and bringing said workpiece into sliding contact with said polishing surface while supplying a second polishing liquid comprises pressing said workpiece against said fixed abrasive and bringing said workpiece into sliding contact with said fixed abrasive while supplying a second polishing liquid that does not contain abrasive particles.

6. The method according to claim 4, wherein
polishing said upper layer until said upper layer is planarized over said entire surface of said workpiece comprises polishing said upper layer until said silicon oxide film has a thickness of at most 100 nm.

7. The method according to claim 4, wherein polishing said upper layer until said upper layer is planarized over said entire surface of said workpiece comprises polishing said upper layer until said silicon oxide film has a thickness of at most 50 nm.

8. The method according to claim 4, wherein
pressing said workpiece against said polishing surface and bringing said workpiece into sliding contact with said polishing surface while supplying a third polishing liquid containing a cationic surface-active agent and not containing abrasive particles comprises pressing said workpiece against said polishing surface and bringing said workpiece into sliding contact with said polishing surface while supplying a third polishing liquid containing a cationic surface-active agent that contains at least one organic compound having any one structure of aliphatic amine salt, aliphatic quaternary ammonium salt, benzalkonium salt, benzethonium chloride, pyridinium salt, or imidazolium salt.

9. The method according to claim 4, further comprising:
after polishing said silicon nitride film to a predetermined thickness, cleaning said workpiece by pressing said workpiece against a non-fixed-abrasive pad and bringing said workpiece into sliding contact with said non-fixed-abrasive pad while supplying pure water or a chemical liquid not containing abrasive particles.

10. The method according to claim 4, further comprising:
after polishing said silicon nitride film to a predetermined thickness, cleaning said workpiece while supplying diluted hydrofluoric acid.

11. The method according to claim 4, wherein
pressing a workpiece against a polishing surface and bringing said workpiece into sliding contact with said polishing surface while supplying a first polishing liquid comprises pressing said workpiece against a polishing surface on a polishing table and bringing said workpiece into sliding contact with said polishing surface while supplying said first polishing liquid, and/or
pressing said workpiece against a polishing surface and bringing said workpiece into sliding contact with said polishing surface while supplying a second polishing liquid comprises pressing said workpiece against a polishing surface on a polishing table and bringing said workpiece into sliding contact with said polishing surface while supplying said second polishing liquid.

12. The method according to claim 4, further comprising:
after polishing said planarized upper layer until said portion of said silicon oxide film is removed to expose substantially an entire surface of said silicon nitride film, cleaning said workpiece by pressing said workpiece against a non-fixed-abrasive pad and bringing said workpiece into sliding contact with said non-fixed-abrasive pad while supplying pure water or a chemical liquid not containing abrasive particles.

13. The method according to claim 4, further comprising:
after polishing said planarized upper layer until said portion of said silicon oxide film is removed to expose substantially an entire surface of said silicon nitride film, cleaning said workpiece while supplying diluted hydrofluoric acid.

14. The method according to claim 4, further comprising at least one of:
while polishing said upper layer, detecting a polishing endpoint by
(i) noticing a change in a torque current of a motor driving a table supporting said polishing surface,
(ii) noticing a change in a thickness of said silicon oxide film, and
(iii) noticing a change in an optical reflectance of a material; and
while polishing said planarized upper layer, detecting a polishing endpoint by
(i) noticing a change in a torque current of a motor driving a table supporting said polishing surface,
(ii) noticing a change in a thickness of said silicon oxide film, and
(iii) noticing a change in an optical reflectance of a material.

15. A method for polishing a workpiece, comprising:
pressing a workpiece, having a non-flat upper layer composed of a silicon oxide film and a lower layer composed partly of a silicon nitride film, against a polishing surface and bringing said workpiece into sliding contact with said polishing surface while supplying a first polishing liquid containing an anionic surface-active agent or pure water, thereby polishing said upper layer at a first rate until said upper layer becomes planarized over an entire surface of said workpiece;
and then pressing said workpiece against a polishing surface and bringing said workpiece into sliding contact with said polishing surface while supplying a second polishing liquid containing an anionic surface-active agent, thereby polishing the planarized upper layer at a second rate until a portion of said silicon oxide film is removed to expose substantially an entire surface of said silicon nitride film,
with said first rate being greater than said second rate.

16. The method according to claim 15, wherein
polishing said upper layer at said first rate and polishing said planarized upper layer at said second rate includes at least one of
(i) pressing said upper layer against said polishing surface under a first surface pressure and pressing said planarized upper layer against said polishing surface under a second surface pressure, with said first surface pressure being greater than said second surface pressure,
(ii) moving said upper layer relative to said polishing surface at a first speed and moving said planarized upper layer relative to said polishing surface at a second speed, with said first speed being greater than said second speed, and
(iii) dressing said polishing surface under a first intensity in association with polishing said upper layer and dressing said polishing surface under a second intensity in association with polishing said planarized upper layer, with said first intensity being greater than said second intensity.

17. The method according to claim 16, wherein
dressing said polishing surface under said first intensity comprises dressing said polishing surface by using at least one of a dresser with diamond particles fixed to a metal or ceramic plate, a nylon brush, a ceramic plate with surface irregularities, a carbon fiber brush, a fixed abrasive, a water jet stream, a cavitation jet stream, an ultrasonic oscillator, ultraviolet rays, and a laser beam, and dressing said polishing surface under said second intensity comprises dressing said polishing surface by using at least one of a dresser with diamond particles fixed to a metal or ceramic plate, a nylon brush, a ceramic plate with surface irregularities, a carbon fiber brush, a fixed abrasive, a water jet stream, a cavitation jet stream, an ultrasonic oscillator, ultraviolet rays, and a laser beam.

18. A method for polishing a workpiece, comprising:

pressing a workpiece, having a non-flat upper layer composed of a silicon oxide film and a lower layer composed partly of a silicon nitride film, against a polishing surface and bringing said workpiece into sliding contact with said polishing surface while supplying a first polishing liquid containing an anionic surface-active agent or pure water, thereby polishing said upper layer until said upper layer becomes planarized over an entire surface of said workpiece; then pressing said workpiece against a polishing surface and bringing said workpiece into sliding contact with said polishing surface while supplying a second polishing liquid containing an anionic surface-active agent, thereby polishing the planarized upper layer until a portion of said silicon oxide film is removed to expose substantially an entire surface of said silicon nitride film; and at least one of:

(i) in association with polishing said upper layer, ejecting a pressurized fluid comprising a mixture of a gas and a liquid to said polishing surface, with said liquid comprising pure water or a surface-active agent; and (ii) in association with polishing said planarized upper layer, ejecting a pressurized fluid comprising a mixture of a gas and a liquid to said polishing surface, with said liquid comprising pure water or a surface-active agent.

* * * * *